(12) United States Patent
Huang et al.

(10) Patent No.: US 10,526,703 B2
(45) Date of Patent: Jan. 7, 2020

(54) FILM FORMATION APPARATUS FOR FORMING SEMICONDUCTOR STRUCTURE HAVING SHOWER HEAD WITH PLURAL HOLE PATTERNS AND WITH CORRESPONDING DIFFERENT PLURAL HOLE DENSITIES

(71) Applicant: TAIWAN SEMICONDUCTOR MANUFACTURING COMPANY LTD., Hsinchu (TW)

(72) Inventors: Chih-Hui Huang, Tainan County (TW); Sheng-Chan Li, Tainan (TW); Cheng-Hsien Chou, Tainan (TW); Cheng-Yuan Tsai, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/922,250

(22) Filed: Mar. 15, 2018

(65) Prior Publication Data
US 2019/0284695 A1    Sep. 19, 2019

(51) Int. Cl.
*C23C 16/455* (2006.01)
*H01L 23/00* (2006.01)
*H01L 21/687* (2006.01)
*C23C 16/458* (2006.01)

(52) U.S. Cl.
CPC .... *C23C 16/45565* (2013.01); *C23C 16/4583* (2013.01); *H01L 21/68714* (2013.01); *H01L 24/02* (2013.01); *H01L 2224/0236* (2013.01); *H01L 2224/02317* (2013.01)

(58) Field of Classification Search
CPC ......... H01L 21/68714; C23C 16/45563; C23C 16/45565; C23C 16/45568; C23C 16/45578; C23C 16/4558; C23C 16/4583
See application file for complete search history.

(56) References Cited

U.S. PATENT DOCUMENTS

| | | | | |
|---|---|---|---|---|
| 5,676,758 A | * | 10/1997 | Hasegawa | C23C 16/455 118/723 E |
| 6,050,506 A | * | 4/2000 | Guo | C23C 16/45565 239/558 |
| 8,402,918 B2 | * | 3/2013 | Kadkhodayan | H01J 37/3255 118/723 E |
| 2011/0300716 A1 | * | 12/2011 | Park | C23C 16/36 438/758 |

(Continued)

*Primary Examiner* — Stephen W Smoot
(74) *Attorney, Agent, or Firm* — WPAT, P.C., Intellectual Property Attorneys; Anthony King

(57) ABSTRACT

A film forming apparatus includes a reaction chamber, a pedestal disposed inside the reaction chamber and configured to support a substrate, and a gas shower head over the pedestal. The gas shower head includes a plurality of first holes and a plurality of second hole disposed between a circumference of the gas shower head and the first holes. The first holes are arranged to form a first pattern and configured to form a first portion of a material film on the substrate. The second holes are arranged to form a second pattern and configured to form a second portion of the material film on the substrate. A hole density of the second pattern is greater than a hole density of the first pattern.

20 Claims, 13 Drawing Sheets

(56) References Cited

U.S. PATENT DOCUMENTS

| | | | |
|---|---|---|---|
| 2012/0222815 A1* | 9/2012 | Sabri | C23C 16/45565 156/345.34 |
| 2016/0099147 A1* | 4/2016 | Kulshreshtha | C23C 16/26 438/16 |
| 2017/0167024 A1* | 6/2017 | Wiltse | C23C 16/45574 |
| 2019/0062918 A1* | 2/2019 | Shaikh | H01L 21/68771 |

* cited by examiner

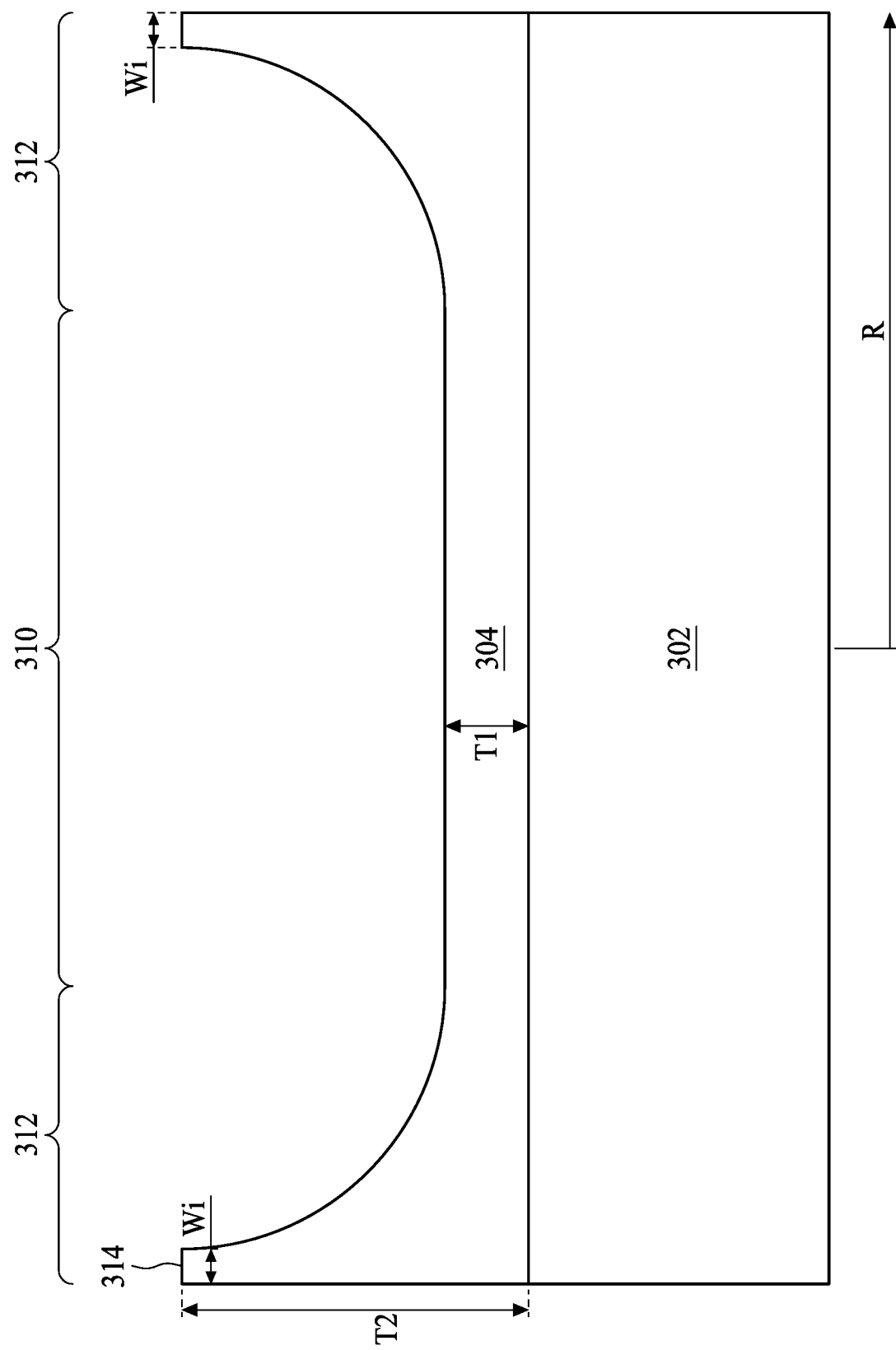

FILM FORMATION APPARATUS FOR FORMING SEMICONDUCTOR STRUCTURE HAVING SHOWER HEAD WITH PLURAL HOLE PATTERNS AND WITH CORRESPONDING DIFFERENT PLURAL HOLE DENSITIES

BACKGROUND

In the semiconductor industry, apparatus, such as chemical vapor deposition (CVD) apparatus, for forming films has been used to deposit various layers over the substrate. However, for larger wafer sizes, control over film profile becomes more difficult and CVD has issues of film profile uniformity, such as development of protrusions and/or depressions in the film. Control over spacing between a shower head and the substrate, the power supplies, or the flow of dilution gases has not provided satisfactory control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
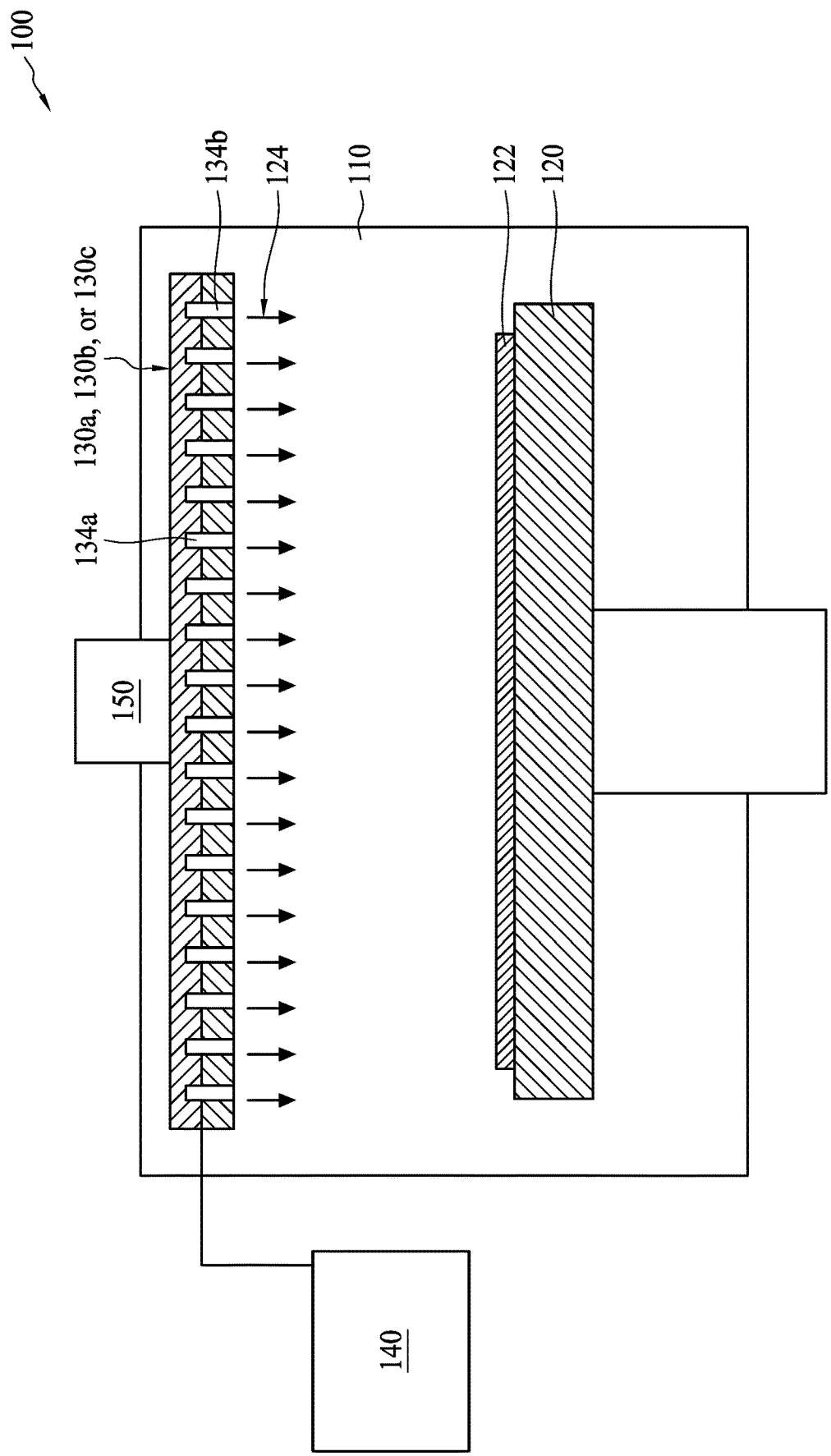
FIG. 1 is schematic drawing illustrating a film formation apparatus according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

CVD is a chemical-based process used to deposit thin semiconductor material films or layers on a substrate such as a wafer in the formation of integrated circuit devices such as chips and dies. CVD apparatus generally includes a reaction chamber configured for accommodating a wafer. A reactant gas containing the desired film material chemical precursors is introduced into the reaction chamber to form the semiconductor film. The reaction grows or deposits a generally thin film on the wafer surface which can include a wide array of film materials such as silicon dioxide (SiO$_2$), silicon oxynitride (SiON), polysilicon, silicon nitride (SiN) dielectrics, etc.

In some embodiments, the films formed near the edge or peripheral regions of the wafer may be thinner than the central region of the wafer. Further, the wafer edge thickness profile may drop due to metal edge bead removal (EBR) or photoresist (PR) wafer edge expose (WEE). Consequently, the resulting unevenness leads to reliability problems. For example, in some embodiments, when two wafers are bonded and a wafer thin down operation is performed to thin down the bonded wafer from a back side of one of the bonded wafers. However, since the films are thinner at the wafer edge, sufficient support is lacked, and thus the bonded wafers suffer from peeling at the wafer edge.

The present disclosure therefore provides a film formation apparatus and a method for forming a film on a substrate to mitigate the edge thickness drop issue. Consequently, a material film with thicker portion near edge or circumference of the substrate is obtained. Further, the thicker portion near the edge or the circumference of the substrate provides sufficient strength and serves as a support during wafer thinning operations. Accordingly, edge peeling issue is mitigated and thus process yield is improved.

FIG. 1 is a schematic drawing illustrating a film formation apparatus 100 according to aspects of the present disclosure in some embodiments. In some embodiments, the film formation apparatus 100 is a chemical vapor deposition (CVD) apparatus. In some embodiments, the film formation apparatus 100 is a plasma-enhanced CVD (PECVD) apparatus or a metal-organic CVD (MOCVD) apparatus. In some embodiments, the film formation apparatus 100 can be, atomic layer deposition (ALD) apparatus, remote plasma enhanced CVD (RPECVD) apparatus, liquid source misted chemical deposition (LSMCD) apparatus, furnace, single wafer furnace or other apparatus in which chemical, gas or plasma is provided (collectively, "semiconductor processing apparatus").

Referring to FIG. 1, the film formation apparatus 100 includes a reaction chamber 110, a pedestal 120 disposed inside the reaction chamber 110, and a gas shower head 130a, 130b or 130c over the pedestal 120. In some embodiments, the film formation apparatus 100 further includes a power supply 140 and a gas supply system 150. The pedestal 120 is disposed inside the reaction chamber 110 and positioned centrally in the reaction chamber 110. The pedestal 120 is configured to support a substrate 122 on which a film is to be formed. In some embodiments, the pedestal 120 can be a substantially flat platter configured for supporting the substrate 122 and supported by a vertically-oriented stem or shaft. The pedestal 120 can include an electrostatic chuck, vacuum system, clamp or other apparatus that is able to keep the substrate 122 thereon. In some embodiments, the pedestal 120 can include a heater (not shown) to enhance the film formation. In some embodiments, the pedestal 120 can include a bottom electrode coupled to a power supply (not shown) so as the enhance plasma within the reaction chamber 110. In some embodiments, the pedestal 120 can include a conduit (not shown) connected to an exhaust pump to exhaust gases or plasmas.

The power supply 140 can be, for example but not limited to, a radio frequency (RF) power supply or other power supply. In some embodiments, the power supply 140 is configured to provide a high voltage sufficient to ionize a gas 124 provided from the gas shower head 130a, 130b, or 130c. Further, the high voltage is provided to generate plasma in the reaction chamber 110. In some embodiments, when generation of plasma is not required, such power supply 140 can be eliminated from the film formation apparatus 100. The gas supply system 150 is coupled to the gas shower head 130a, 130b or 130c, and is operable to dispense the gas 124 to the substrate 122 inside the reaction chamber 110. In some embodiments, the gas supply system 150 may dispense the gas 124 such as reactant gas or dilution gas to the gas shower head 130a, 130b or 130c through various apparatus such as flow lines, pressure regulators, valves, mass flow controllers, or other flow controllers, manifolds, and/or regulators. The reaction chamber 110, the pedestal 120, the power supply 140, the gas supply system 150, and the gas shower head 130a, 130b or 130c can be selected to provide a desire film formation apparatus 100.

In some embodiments, the film formation apparatus 100 is provided for forming thin films on the substrate 122, which in some embodiments without limitation is a wafer. It will be appreciated that although the substrate 122 is described for convenience in exemplary embodiments in the present disclosure with respect to a wafer, the substrate may be a type, configuration, or size of semiconductor substrate that is amenable to processing in the film formation apparatus 100. Accordingly, the present disclosure is not limited to substrates in the form of a semiconductor wafer along. In some embodiments, the substrate 122 can be a silicon substrate, a compound substrate, a glass substrate, a liquid crystal display substrate, a printed circuit board (PCB), or any other substrate similar thereto. In some embodiments, the substrate 122 can be a blank substrate or includes a variety of integrated devices or circuits, or layer for forming such thereon, though not shown.

Figure 2:
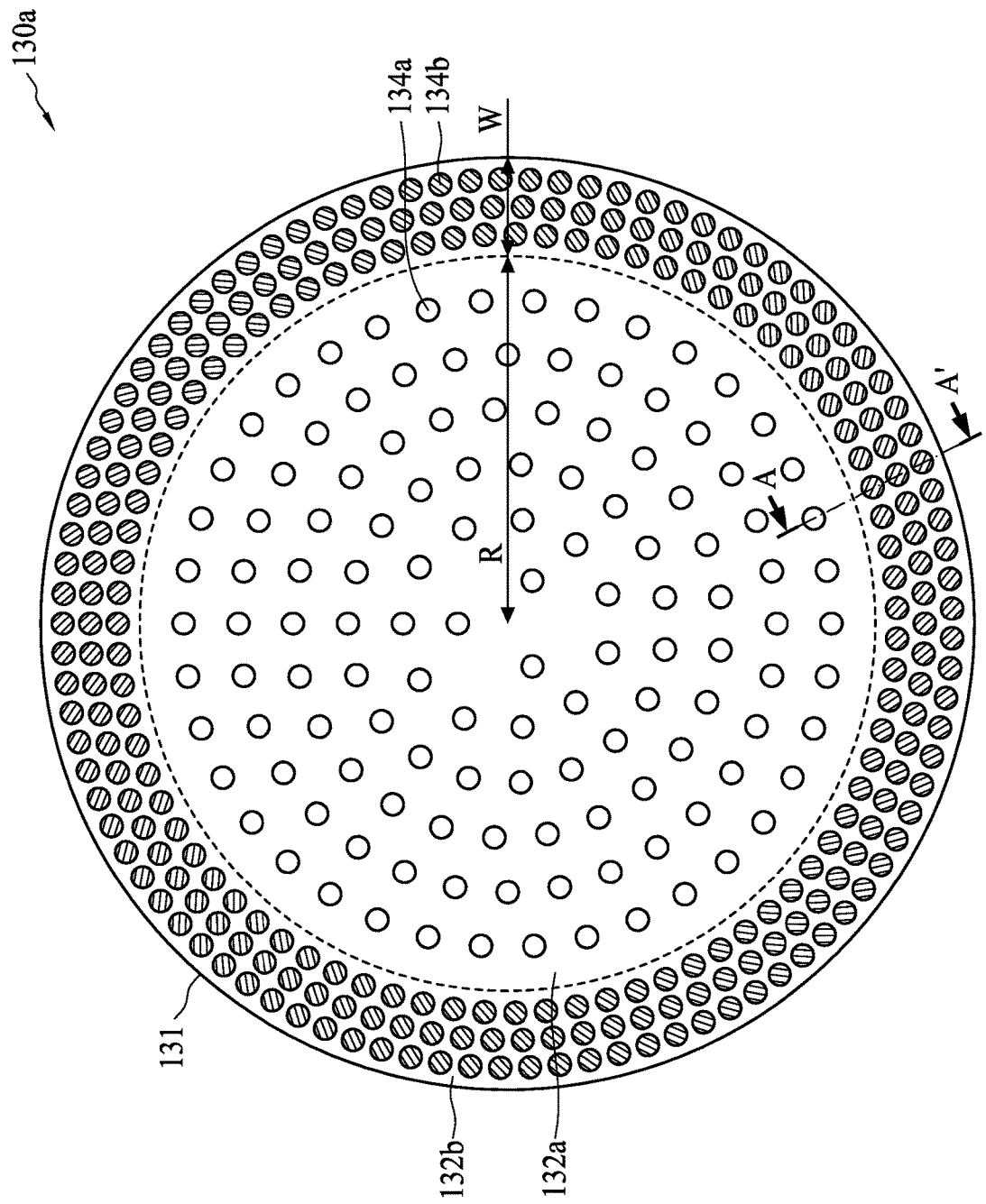
FIG. 2 illustrates a shower head design in accordance with embodiments of the present disclosure.
Figure 3:
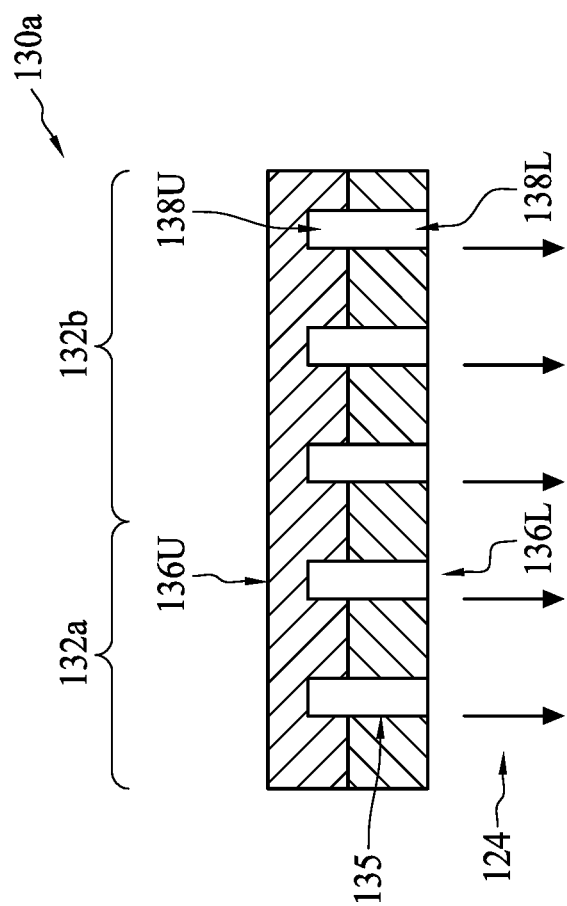
FIG. 3 is an enlarged cross-sectional view taken along a line A-A' of FIG. 2.

Please refer to FIGS. 2 and 3, wherein FIG. 2 is a bottom view of a gas shower head 130a and FIG. 3 is an enlarged cross-sectional view taken along a line A-A' of FIG. 2 in aspects of the present disclosure in one or more embodiments. In some embodiments, the film formation apparatus 100 includes the gas shower head 130a. The gas shower head 130a includes a plate 131. The plate 131 can be, but need not necessarily, round, oval, rectangular, square or other desired shape corresponding to the shape of the substrate 122 where the film to be formed. In some embodiments, the plate 131 of the gas shower head 130a can include a central region 132a and a peripheral region 132b defined thereon. As shown in FIG. 2, the central region 132a can include a round shape while the peripheral region 132b includes a ring shape encircling the central region 132a. In other words, the peripheral region 132b is defined between the central region 132a and a circumference of the plate 131, as shown in FIG. 2. The central region 132a includes a radius R, and the peripheral region 132b includes a width W. In some embodiments, the radius R of the central region 132a is greater than the width W of the peripheral region 132b, but the disclosure is not limited thereto.

Referring to FIGS. 2 and 3, in some embodiments, the gas shower head 130a includes a plurality of central holes 134a disposed in the central region 132a of the plate 131, and a plurality of peripheral holes 134b disposed in the peripheral region 132b of the plate 131. The central holes 134a include an upper opening 136U coupled to the gas supply system 150, and the peripheral holes 134b include an upper opening 138U coupled to the gas supply system 150. In some embodiments, the upper opening 136U of the central holes 134a and the upper opening 138U of the peripheral holes 134b are identical, but the disclosure is not limited to this. The central holes 134a include a lower opening 136L to dispense the gas 124 to the substrate 122, and the peripheral holes 134b include lower opening 138L to dispense the gas 124 to the substrate 122. In some embodiments, the lower opening 136L of the central holes 134a and the lower opening 138L of the peripheral holes 134b are identical, but the disclosure is not limited to this. Additionally, the central holes 134a respectively include a sidewall 135 coupling the upper opening 136U and the lower opening 136L, and the peripheral holes 134b respectively include a sidewall 135 coupling the upper opening 138U and the lower opening 138L.

In some embodiments, the central holes 134a are arranged to form a first pattern, and the peripheral holes 134b are arranged to form a second pattern. In some embodiments, a hole density in the peripheral region 132b is greater than the a hole density in the central region 132a. In other words, the hole density of the second pattern formed by the peripheral holes 134b is greater than the hole density of the first pattern formed by the central holes 134a. In some embodiments, the hole density in the peripheral region 132b is 2-4 times the hole density of the central region 132a, but the disclosure is not limited thereto. In some embodiments, a maximum hole density in the peripheral region 132b is about 20 holes/mm$^2$, but the disclosure is not limited thereto. In some embodiments, the central holes 134a and the peripheral holes 134b are arranged in concentric circles, but the disclosure is not limited thereto. In some embodiments, the central holes 134a and the peripheral holes 134b have a same shape and a same hole diameter, but the disclosure is not limited thereto. In some embodiments, a distance between any two neighboring central holes 134a can be, for example but not limited to, consistent. Similar, a distance between any two neighboring peripheral holes 134b can be, for example but not limited to, consistent. However, the distance between any two neighboring peripheral holes 134b is less than the distance between any two neighboring central holes 134a, as shown in FIG. 2. The central holes 134a and the peripheral holes 134b are all coupled to the gas supply system 150.

Figure 4:
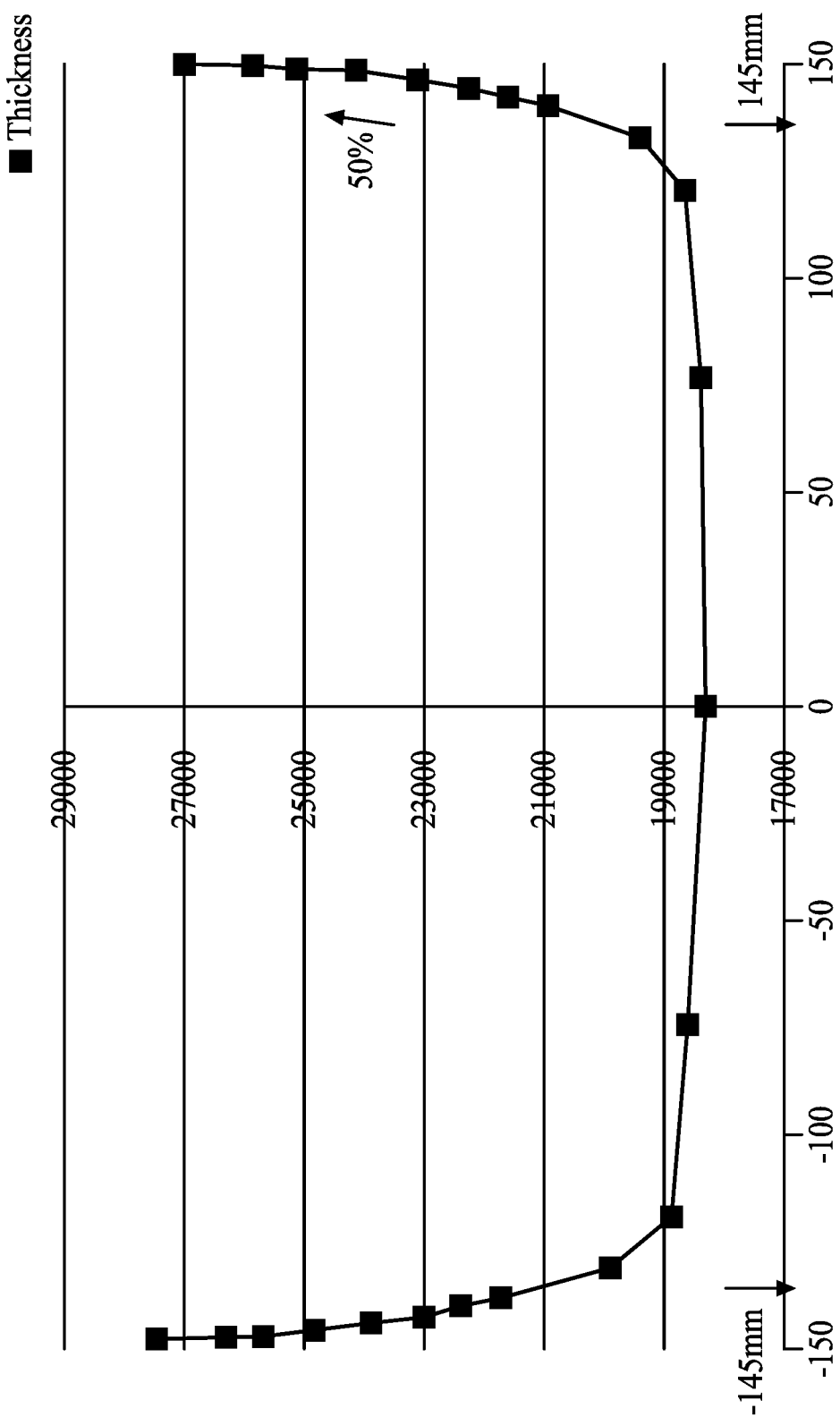
FIG. 4 is a film profile corresponding to the shower head of FIG. 2 in accordance with embodiments of the present disclosure.

Referring to FIG. 4, which illustrates a film profile obtained by using the gas shower head 130a based upon deposition parameters such as the precursor gases used, gas flow, process temperature, and process pressure. As mentioned above, the central holes 134a and the peripheral holes 134b coupled to the gas supply system 150 have the same shape and diameter. Accordingly, the used gases, the gas flow, the gas temperature and the gas pressure measured from the central holes 134a and the peripheral holes 134b may be similar. However, since the hole density in the peripheral region 132b is greater than the hole density in the central region 132a, a material film formed by using the film formation apparatus 100 may include different thicknesses. As shown in FIG. 4, the material film formed by using the film formation apparatus 100 may include a first portion corresponding to the central region 132a and a second portion corresponding to the peripheral region 132b. In other words, the central holes 134a are configured to deposit the first portion of the material film on the substrate 122, and the peripheral holes 134b are configured to deposit the second portion of the material film on the substrate 122. Accordingly, the first portion of the material film may include a round shape while the second portion of the material film may include a ring shape that encircling the first portion. In other words, the second portion is defined between the first portion and a circumference of the material film. As shown in FIG. 4, in some embodiments when the substrate 122 includes a radius about 150 micrometers (mm), the first portion of the material film may include a round shape having a radius about 145 mm while the second portion of the material film may include a ring shape having width about 5 mm, but the disclosure is not limited thereto. More importantly, a thickness of the second portion is greater than a thickness of the first portion since the hole density in the peripheral region 132b is greater than the hole density in the central region 132a. In some embodiments, the thickness of the second portion of the material film is two times the thickness of the first portion of the material film, but the disclosure is not limited thereto. In some embodiments, the thickness of the second portion of the material film is greater than the thickness of the first portion of the material film from about 2000 angstroms (Å) to about 10000 Å, but the disclosure is not limited thereto. In some embodiments, the profile of the material film includes a U shape, as shown in FIG. 4, but the disclosure is not limited thereto.

Figure 5:
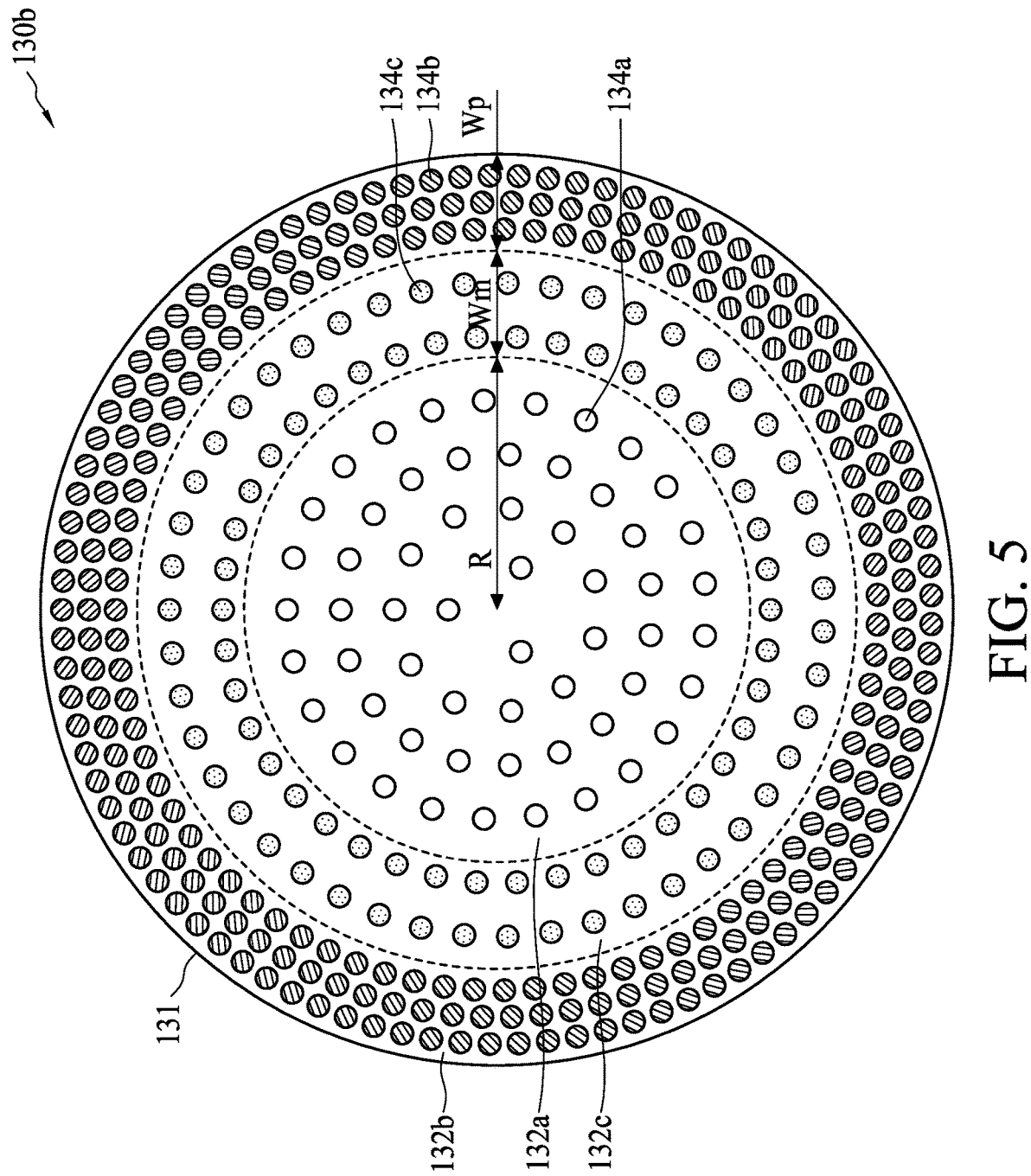
FIG. 5 illustrates a shower head design in accordance with embodiments of the present disclosure.

Please refer to FIG. 5, which is a bottom view of a gas shower head 130b. In some embodiments, the film formation apparatus 100 includes the gas shower head 130b. The gas shower head 130b includes a plate 131. The plate 131 can be, but need not necessarily, round, oval, rectangular, square or other desired shape corresponding to the shape of the substrate 122 where the film to be formed. In some embodiments, the plate 131 of the gas shower head 130b can include a central region 132a, a peripheral region 132b and a middle region 132c defined thereon. As shown in FIG. 5, the central region 132a can include a round shape, the middle region 132c can include a ring shape encircling the central region 132a, and the peripheral region 132b can include a ring shape encircling both of the central region 132a and the middle region 132c. In other words, the peripheral region 132b is defined between the central region 132a and a circumference of the plate 131, and the middle region 132c is between the peripheral region 132b and the central region 132a, as shown in FIG. 5. The central region 132a includes a radius R, the peripheral region 132b includes a width Wp, and the middle region 132c includes a width Wm. In some embodiments, the radius R of the central region 132a is greater than the width Wp of the peripheral region 132b and the width Wm of the middle region 132c, but the disclosure is not limited thereto. In some embodiments, the width Wp of the peripheral region 132b is substantially equal to the width Wm of the middle region 132c, but the disclosure is not limited thereto. Additionally, the central holes 134a, the middle holes 134c and the peripheral holes 134b respectively include an upper opening coupled to the gas supply system 150, a lower opening to dispense the gas 124 to the substrate 122, and sidewall coupling the upper opening and the lower opening, as shown in FIG. 3, but those details are omitted for simplicity.

Referring to FIG. 5, in some embodiments, the gas shower head 130b includes a plurality of central holes 134a disposed in the central region 132a of the plate 131, a plurality of peripheral holes 134b disposed in the peripheral region 132b of the plate 131, and a plurality of middle holes 134c disposed in the middle region 132c of the plate 131. The central holes 134a are arranged to form a first pattern, the peripheral holes 134b are arranged to form a second pattern, and middle holes 134c are arranged to form a third pattern. In some embodiments, the first pattern formed by the central holes 134a includes a first hole density, the second pattern formed by the peripheral holes 134b includes a second hole density, and the third pattern formed by the middle holes 134c includes a third hole density. In some embodiments, the second hole density is greater than the first hole density, and the third hole density is between the first hole density and the second hole density. In some embodiments, a maximum hole density of the second pattern formed by the peripheral holes 134b is about 20 holes/mm$^2$, but the disclosure is not limited thereto. In some embodiments, the central holes 134a, the middle holes 134c and the peripheral holes 134b are arranged in concentric circles, but the disclosure is not limited thereto. In some embodiments, the central holes 134a can be taken as first holes 134a while the middle holes 134c and the peripheral holes 134b are can be taken as second holes 134b and 134c that are disposed between the circumference of the gas shower head 130b and the first holes 134a. The hole density of the pattern formed by the second holes 134b and 134c is greater than the density of the first holes 134a. In some embodiments, the hole density of pattern formed by the second holes 134b and 134c is at least 2-4 times the hole density of the pattern formed by the first holes 134a. In some embodiments, the first holes 134a and the second holes 134b and 134c are arranged in concentric circles from a center of the gas shower head 130b and the circumference of the gas shower head 130b, and the hole density of the pattern formed by the second holes 134c and 134b are increased outwardly, as shown in FIG. 5, but the disclosure is not limited thereto. In some embodiments, the central holes 134a, the middle holes 134c and the peripheral holes 134b have a same shape and a same hole diameter, but the disclosure is not limited thereto. In some embodiments, a distance between any two neighboring central holes 134a can be, for example but not limited to, consistent. Similar, a distance between any two neighboring peripheral holes 134b can be, for example but not limited to, consistent. And a distance between any two neighboring middle holes 134c can be, for example but not limited to, consistent. However, the distance between any two neighboring peripheral holes 134b is less than the distance between any two neighboring middle holes 134c, and the distance between any two neighboring middle holes 134c is less than the distance between any two neighboring central holes 134a, as shown in FIG. 5. Further, the central holes 134a, the middle holes 134c and the peripheral holes 134b are all coupled to the gas supply system 150.

Figure 6:
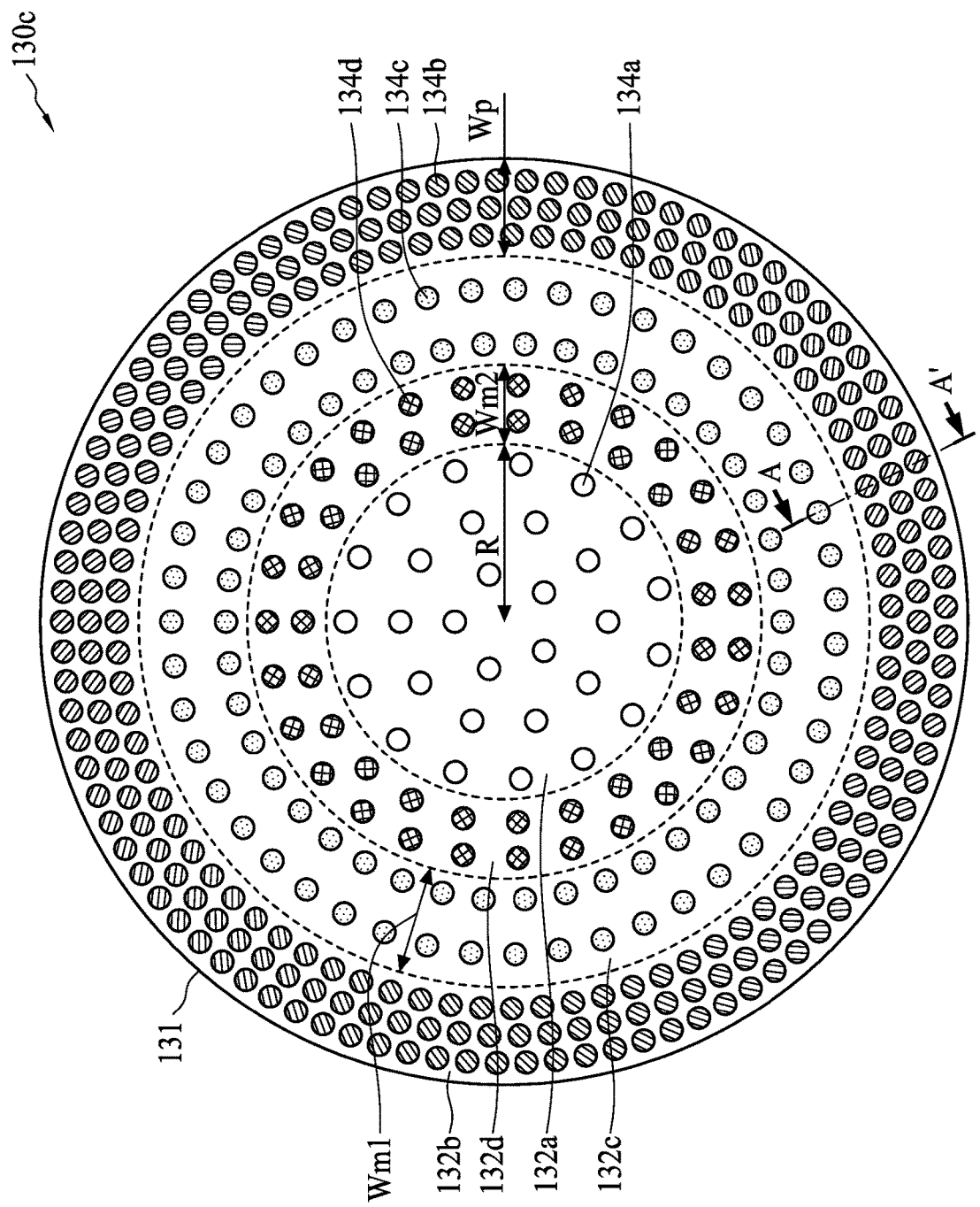
FIG. 6 illustrates a shower head design in accordance with embodiments of the present disclosure.

Please refer to FIG. 6, which is a bottom view of a gas shower head 130c. In some embodiments, the film formation apparatus 100 includes the gas shower head 130c. The gas shower head 130b includes a plate 131. The plate 131 can be, but need not necessarily, round, oval, rectangular, square or other desired shape corresponding to the shape of the substrate 122 where the film to be formed. In some embodiments, the plate 131 of the gas shower head 130c can include a central region 132a, a peripheral region 132b, a first middle region 132c and a second middle region 132d defined thereon. As shown in FIG. 6, the central region 132a can include a round shape, the second middle region 132d includes a ring shape encircling the central region 132a, the first middle region 132c includes a ring shape encircling the central region 132a and the second middle region 132d, and the peripheral region 132b includes a ring shape encircling the central region 132a, the second middle region 132d and the first middle region 132c. In other words, the peripheral region 132b is defined between the central region 132a and a circumference of the plate 131, the first middle region 132c is between the peripheral region 132b and the central region 132a, and the second middle region 132d is between the first middle region 132c and the central region 132a, as shown in FIG. 6. The central region 132a includes a radius R, the peripheral region 132b includes a width Wp, the first middle region 132c includes a width Wm1, and the second middle region 132d include a width Wm2. In some embodiments, the radius R of the central region 132a is greater than the width Wp of the peripheral region 132b and the width Wm1 of the first middle region 132c and the width Wm2 of the second middle region 132d, but the disclosure is not limited thereto. In some embodiments, the width Wp of the peripheral region 132b, the width Wm1 of the first middle region 132c and the width Wm2 of the second middle region 132d can be substantially the same, but the disclosure is not limited thereto. It should be easily realize that the width Wp of the peripheral region 132b, the width Wm1 of the first middle region 132c and the width Wm2 of the second middle region 132d can be adjusted depending on different process requirements.

Additionally, although there are two middle regions 132c and 132d being mentioned and depicted, those skilled in the art would easily realize that the middle region can be further divided from one middle region to a plurality of middle regions, depending on different process requirements.

Referring to FIG. 6, in some embodiments, the gas shower head 130c includes a plurality of central holes 134a disposed in the central region 132a of the plate 131, a plurality of peripheral holes 134b disposed in the peripheral region 132b of the plate 131, a plurality of first middle holes 134c disposed in the first middle region 132c of the plate 131, and a plurality of second middle holes 134d disposed in the second middle region 132d of the plate 131. Additionally, the central holes 134a, the first middle holes 134c, the second middle holes 134d and the peripheral holes 134b respectively include an upper opening coupled to the gas supply system 150, a lower opening to dispense the gas 124 to the substrate 122, and sidewall coupling the upper opening and the lower opening, as shown in FIG. 3, but those details are omitted for simplicity.

In some embodiments, the central holes 134a are arranged to form a first pattern including a first hole density, the peripheral holes 134b are arranged to form a second pattern including a second hole density, the first middle holes 134c are arranged to form a third pattern including a third hole density, and the second middle holes 134d are arranged to form a fourth pattern including a fourth hole density. In some embodiments, the second hole density of the second pattern formed by the peripheral holes 134b is greater than the third hole density of the third pattern formed by the first middle holes 134c, the third hole density is greater than the fourth hole density of the fourth pattern formed by the second middle holes 134d, and the fourth hole density is greater than the first density of the first pattern formed by the central holes 134a. In some embodiments, the central holes 134a, the second middle holes 134d, the first middle holes 134c, and the peripheral holes 134b are arranged in concentric circles, but the disclosure is not limited thereto. In some embodiments, the central holes 134a are taken as first holes 134a while the first middle holes 134c, the second middle holes 134d and the peripheral holes 134b are taken as second holes 134b/134c/134d that are disposed between the circumference of the gas shower head 130c and the first holes 134a. The hole density of a pattern formed by the second holes 134b/134c/134d is greater than the hole density of a pattern formed by the first holes 134a. In some embodiments, the hole density of pattern formed by the second holes 134b/134c/134d is at least 2-4 times the hole density of the pattern formed by the first holes 134a. In some embodiments, the first holes 134a and the second holes 134b/134c/134d are arranged in concentric circles from a center of the gas shower head 130c and the circumference of the gas shower head 130c, and the hole density of the pattern formed by the second holes 134b/134c/134d are outwardly increased to the circumference of the gas shower head 130c, as shown in FIG. 6, but the disclosure is not limited thereto. In some embodiments, the central holes 134a, the first middle holes 134c, the second middle holes 134d and the peripheral holes 134b have a same shape and a same hole diameter, but the disclosure is not limited thereto. In some embodiments, a distance between any two neighboring central holes 134a can be, for example but not limited to, consistent. Similar, a distance between any two neighboring peripheral holes 134b can be consistent, a distance between any two neighboring first middle holes 134c can be consistent, and a distance between any two neighboring second middle holes 134d can be consistent. However, the distance between any two neighboring peripheral holes 134b is less than the distance between any two neighboring first middle holes 134c, the distance between any two neighboring first middle holes 134c is less than the distance between any two neighboring second middle holes 134d, and the distance between any two neighboring second middle holes 134d is less than the distance between any two neighboring central holes 134a, as shown in FIG. 6. Further, the central holes 134a, the first middle holes 134c, the second middle holes 134d and the peripheral holes 134b are all coupled to the gas supply system 150.

Figure 7:
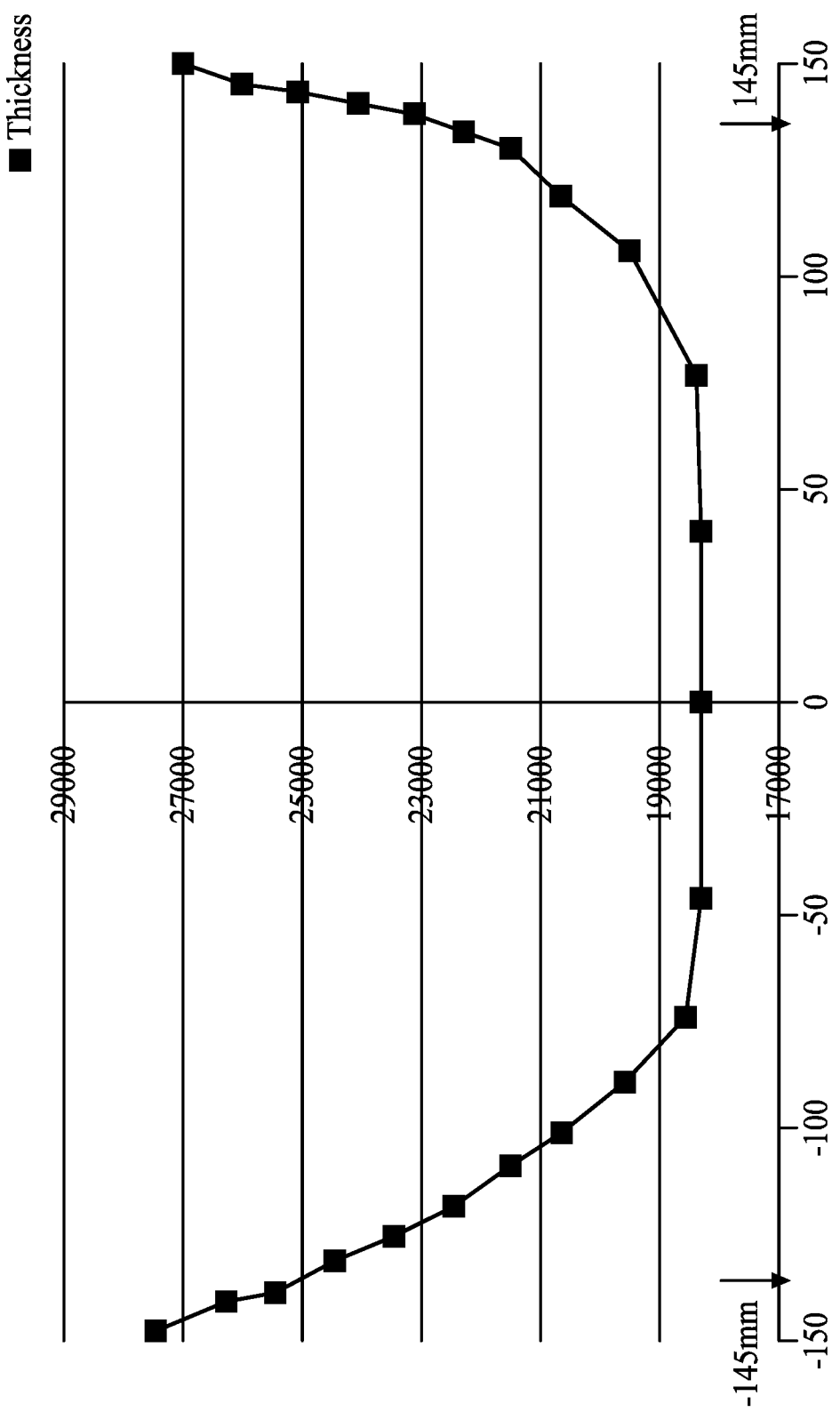
FIG. 7 illustrates a film profile corresponding to the shower head of FIG. 6 in accordance with embodiments of the present disclosure.

Referring to FIG. 7, which illustrates a film profile obtained by using the gas shower head 130c based upon deposition parameters such as the precursor gases used, gas flow, process temperature, and process pressure. As mentioned above, all the holes 134a, 134b, 134c and 134d coupled to the gas supply system 150 have the same shape and diameter. Accordingly, the used gases, the gas flow, the gas temperature and the gas pressure measured from the holes 134a, 134b, 134c and 134d may be similar. However, since the hole density of the patterns formed by the holes 134a, 134b, 134c and 134d are outwardly increased, a material film formed by using the film formation apparatus 100 may include different thicknesses. As shown in FIG. 7, the material film formed by the film formation apparatus 100 may include a first portion corresponding to the central holes 134a, a second portion corresponding to the peripheral holes 134b, a third portion corresponding to the first middle region 134c and a fourth portion corresponding to the second middle region 134d. In other words, the central holes 134a are configured to deposit the first portion of the material film on the substrate 122, the peripheral holes 134b are configured to deposit the second portion of the material film on the substrate 122, the first middle holes 134c are configured to deposit the second portion of the material film on the substrate 122, and the second middle holes 134d are configured to deposit the second portion of the material film on the substrate 122. Accordingly, the first portion of the material film may include a round shape while the fourth portion of the material film may include a ring shape encircling the first portion, the third portion may include a ring shape encircling the fourth portion, and the second portion may include a ring shape encircling the third portion. In other words, the portions of the material film are formed correspondingly to the regions 132a, 132b, 132c and 132d of the gas shower head 130c or correspondingly to the patterns formed by the holes 134a, 134b, 134c and 134d. As shown in FIG. 7, in some embodiments when the substrate 122 includes a radius about 150 mm, a thickness of the material film can be gradually increased from the center of the substrate 122 to the circumference of the substrate 122. In some embodiments, the thickness of the second portion of the material film is two times the thickness of the first portion of the material film, but the disclosure is not limited thereto. In some embodiments, the thickness of the second portion of the material film is greater than the thickness of the first portion of the material film from about 2000 Å to about 10000 Å, but the disclosure is not limited thereto. In some embodiments, the profile of the material film is more like a V shape, but the disclosure is not limited thereto.

Figure 8:
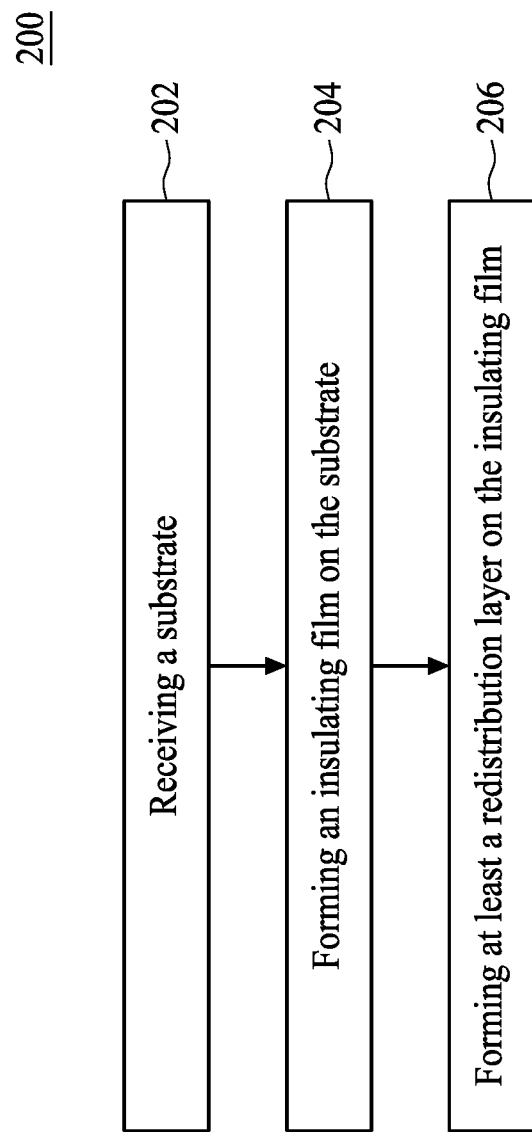
FIG. 8 shows a flow chart representing method for forming a semiconductor structure according to aspects of the present disclosure in one or more embodiments.

Please refer to FIG. 8 and FIGS. 9-11B. FIG. 8 shows a flow chart representing method for forming a semiconductor structure according to aspects of the present disclosure, and FIGS. 9-11B are a series of cross-sectional views of a semiconductor structure at various fabrication stages constructed according to aspects of the present disclosure in one or more embodiments. In the present disclosure, a method for forming a semiconductor structure 200 is also disclosed. In some embodiments, a semiconductor image sensor structure 300 can be formed by the method 200. The method 200 includes a number of operations and the description and illustration are not deemed as a limitation as the sequence of the operations. The method 200 includes a number of operations (202, 204 and 206) as shown in FIG. 8.

Figure 9:
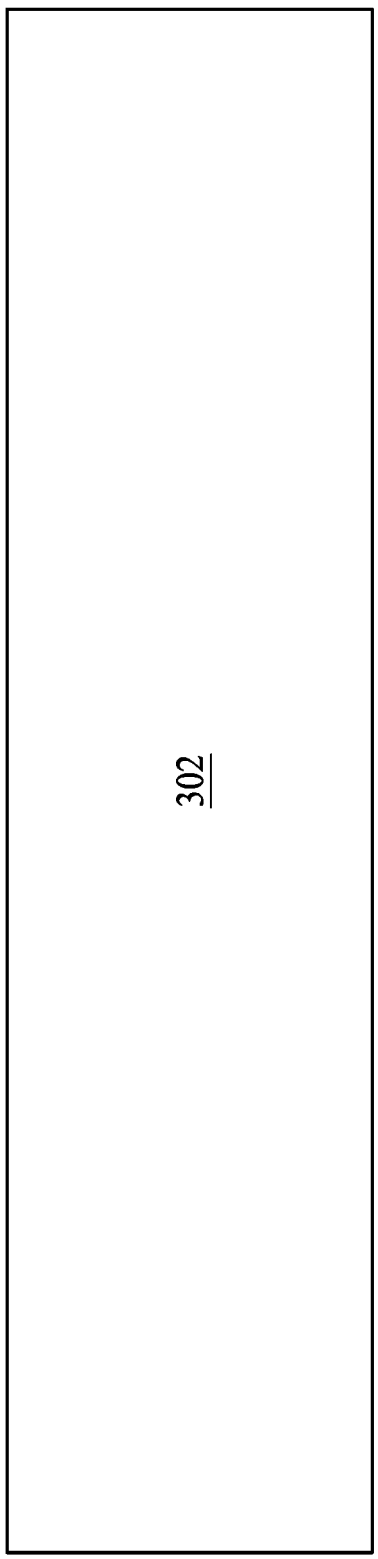
FIGS. 9-11B are a series of cross-sectional views of a semiconductor structure at various fabrication stages constructed according to aspects of the present disclosure in one or more embodiments.

In operation 202, a substrate 302 is received or provided as shown in FIG. 9. In some embodiments, the terms "wafer" and "substrate" used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon. In some embodiments, the substrate 302 can include silicon, silicon germanium, silicon carbon, III-V compound semiconductor material, or the like. The substrate 302 may include active components or circuits, such as conductive features, implantation regions, resistors, capacitors, and other semiconductor elements e.g., transistors, diodes, etc. Those active components or circuits can be formed over the substrate 302 in front-end-of-line (FEOL) operations in some embodiments, for example. An interconnect structure (not shown) can be formed over the substrate 302 in back-end-of-line (BEOL) operations in some embodiments, for example. The interconnect structure includes conductive features, such as conductive lines and vias formed in an insulating material. In some embodiments, the insulating material can include a plurality of dielectric layers.

In some embodiments, the substrate 302 is positioned in the film formation apparatus 100 which includes the gas shower head 103a, 103b or 103c. In step 304, an insulating film 304 is formed on the substrate 302 by performing a film formation operation in the film formation apparatus 100. In some embodiment, the insulating films can include SiO, SiN, SiON or undoped silica glass (USG), but the disclosure is not limited to this. As mentioned above, since the gas shower head 103a, 103b or 103c includes the second holes disposed in the region encircling the central region in which the first holes are disposed, and the density of the second holes is greater than the density of the first holes, the insulating film 304 may include different thickness.

Figure 10A:
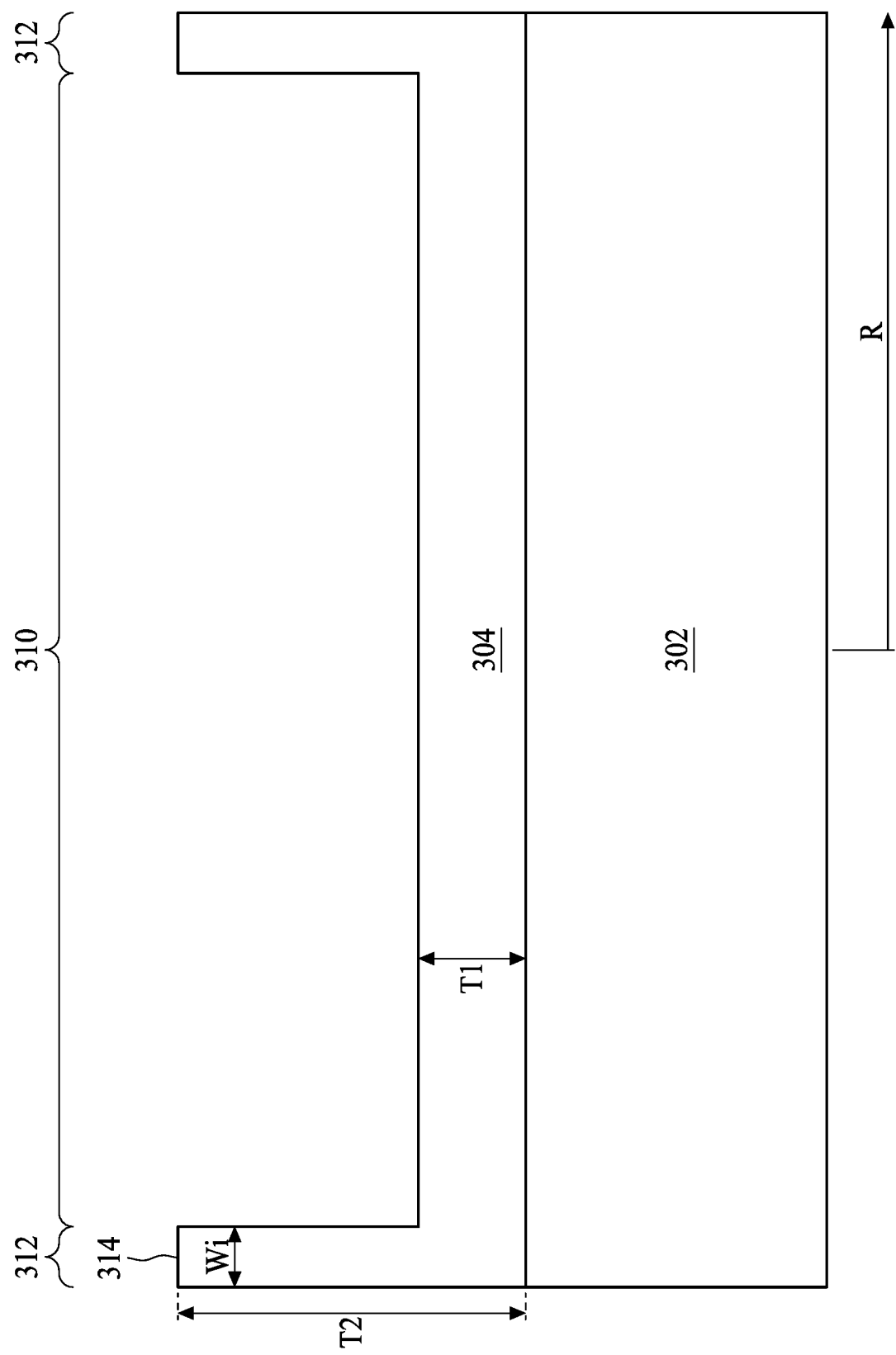

Please refer to FIGS. 10A and 10B. In some embodiments, the insulating film 304 may include at least a first portion 310 and a second portion 312 disposed between the first portion 310 and an edge or a circumference of the insulating film 304. In some embodiments, the first portion 310 is formed correspondingly to the first holes of the gas shower head 103a, 103b or 103c while the second portion 312 is disposed correspondingly to the second holes of the gas shower head 103a, 103b or 103c. Consequently, the first portion 310 includes a round shape, and the second portion 312 includes a ring shape encircling the first portion 310.

Further, the first portion 310 of the insulating film 304 includes a first thickness T1, and the second portion 312 of the insulating film 304 includes a second thickness T2. In some embodiments, the second thickness T2 of the second portion 312 is greater than the first thickness T1, as shown in FIG. 10A. In some embodiments, the second thickness T2 of the second portion 312 is gradually increased to the circumference of the insulating film 304, as shown in FIG. 10B. In some embodiments, the second thickness T2 of the second portion 312 is 2-4 times the first thickness T1 of the first portion 310. In some embodiments, the second thickness T2 of the second portion 312 is greater than the first thickness T1 of the first portion 310 from about 2000 Å to about 10000 Å, but the disclosure is not limited thereto. In other words, a thickness difference ΔT is formed between the first thickness T1 and the second thickness T2, and the thickness difference ΔT is between about 2000 Å and about 10000 Å, but the disclosure is not limited thereto. In some embodiments, the second portion 312 includes a topmost surface 314 as shown in FIGS. 10A and 10B. The topmost surface 314 includes the ring shape encircling the first portion 310 and has a width Wi measured from an edge or a circumference of the insulating film 304, as shown in FIGS. 10A and 10B. In some embodiments, the substrate 302 includes a radius R, and the width Wi of the topmost surface 314 of the second portion 312 is substantially 3%-20% of the radius R of the substrate 302. In some embodiments, when the radius R of the substrate 302 is about 150 mm, the width Wi of the topmost surface 314 of the second portion 312 is about 5 mm, but the disclosure is not limited thereto.

Figure 11A:
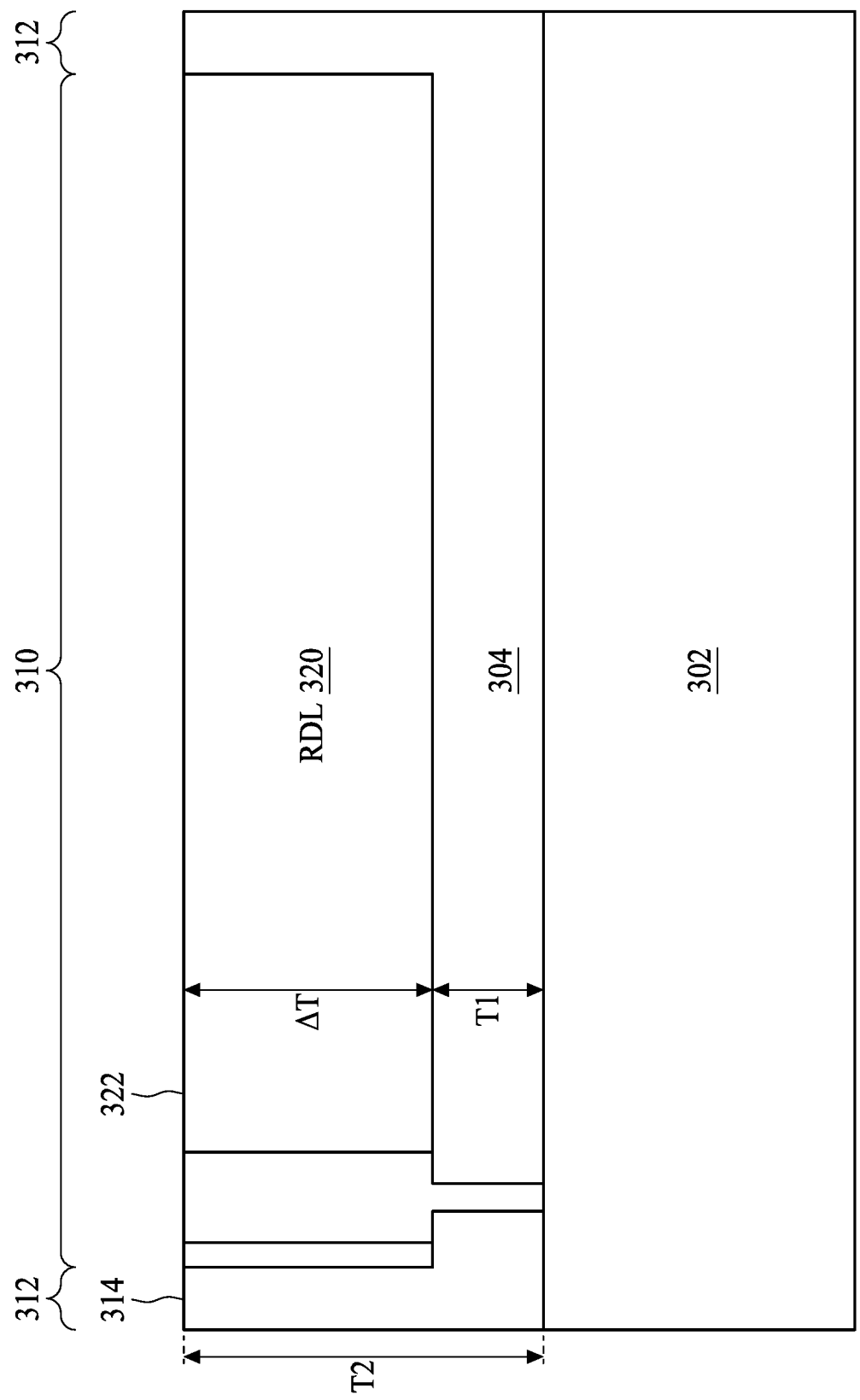
Figure 11B:
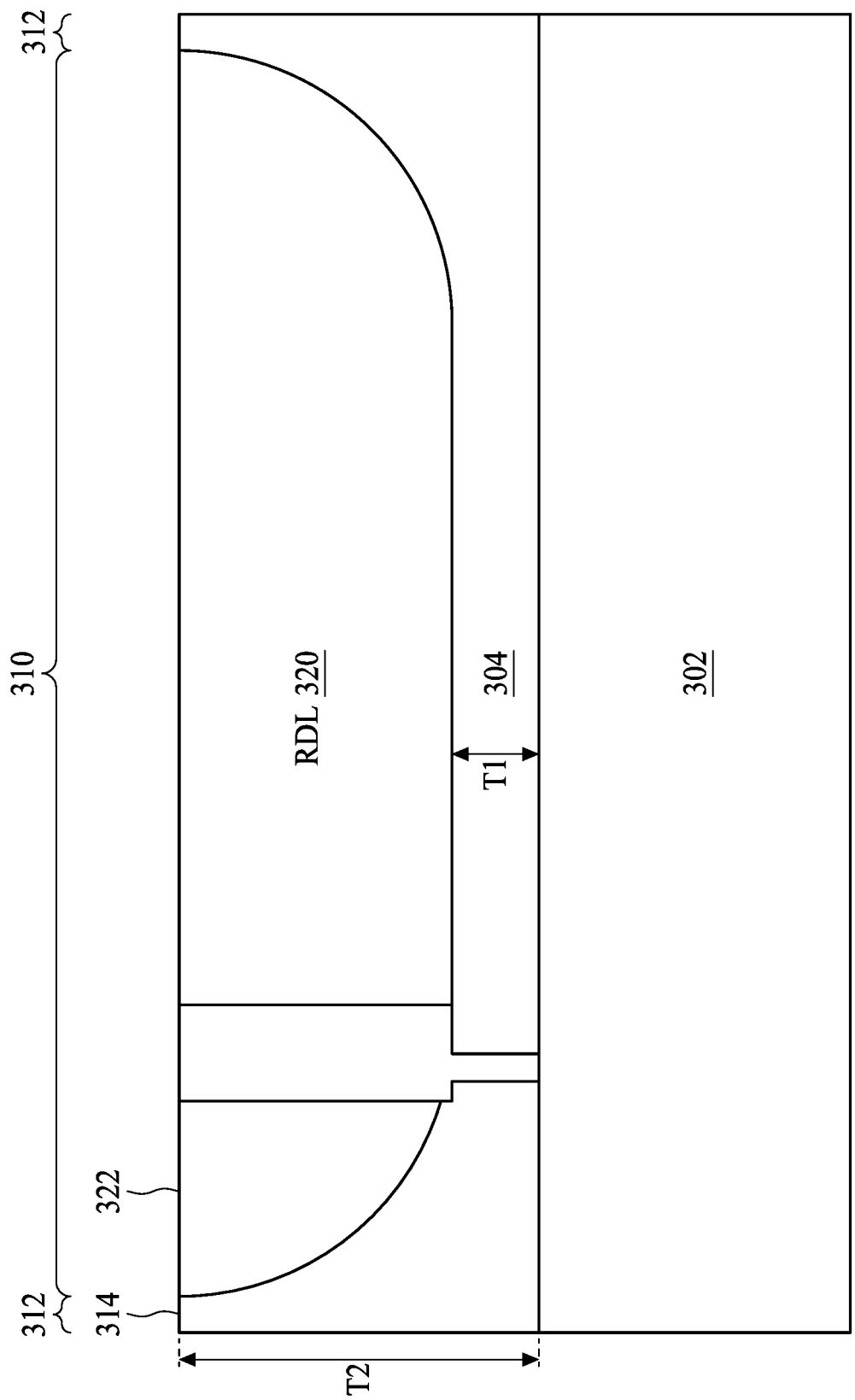

Referring to FIGS. 11A and 11B, in operation 206, at least a redistribution layer (RDL) 320 is formed on the insulating film 304. The RDL 320 is designed to redistribute or relocate bonding pads for chip packaging. In some embodiments, the RDL 320 includes dielectric layer(s) and conductive layer(s). In some embodiments, new bonding pads (not shown) are exposed through the RDL 320 at the desired location. In some embodiments, those dielectric layers and conductive layers may be removed near the edge or the circumference of the substrate 302 due to metal edge bead removal and photoresist wafer edge expose, and thus a ring-shaped vacancy may be formed surrounding the RDL 320. However, such vacancy may be filled with the second portion 312 of the insulating film 304, as shown in FIGS. 11A and 11B. In other words, the second portion 312 compensates the lack of dielectric or conductive layers. In some embodiments, a top surface 322 of the RDL 320 is lower than or substantially level with the topmost surface 314 of the second portion 312 of the insulating film 304, but the disclosure is not limited to this.

In some embodiments, the substrate 302 can be bonded to another substrate which also includes an insulating film formed by using the film formation apparatus 100. In some embodiments, the two substrates are bonded with the RDLs interfaces with each other. In some embodiments, a wafer thinning operation may be performed from a back surface of one of the bonded substrates. In some embodiments, the thicker second portion 312 compensates the lack of dielectric or conductive layers due to metal edge bead removal and photoresist wafer edge expose, and thus provides sufficient strength during wafer thinning operation.

Accordingly, the present disclosure therefore provides a film formation apparatus and a method for forming a film on a substrate, and a method for forming a semiconductor structure that is able to mitigate the edge thickness drop issue. Consequently, a material film with thicker portion near edge or circumference of the substrate is obtained. Further, the thicker portion near the edge or the circumference of the substrate provides sufficient strength and serves as a support during wafer thinning operations. Accordingly, edge peeling issue is mitigated and thus process yield is improved.

In some embodiments, a gas shower head is provided. The gas shower head includes a plate, a plurality of central holes disposed in a central region of the plate, and a plurality of peripheral holes disposed in a peripheral region of the plate. In some embodiments, the central holes are configured to form a first portion of a material film, and the peripheral holes are configured to form a second portion of the material film. In some embodiments, a hole density in the peripheral region is greater than a hole density in the central region. In some embodiments, the first portion of the material film includes a first thickness corresponding to the hole density in central region, and the second portion of the material film includes a second thickness corresponding to the hole density in peripheral region and greater than the first thickness.

In some embodiments, a film forming apparatus is provided. The film forming apparatus includes a reaction chamber, a pedestal disposed inside the reaction chamber and configured to support a substrate, and a gas shower head over the pedestal. In some embodiments, the gas shower head includes a plurality of first holes and a plurality of second hole disposed between a circumference of the gas shower head and the first holes. In some embodiments, the first holes are arranged to form a first pattern and configured to form a first portion of a material film on the substrate, the second holes are arranged to form a second pattern and configured to form a second portion of the material film on the substrate. In some embodiments, a hole density of the second pattern is greater than a hole density of the second pattern.

In some embodiments, a method for forming a semiconductor structure is provided. The method includes the following operations. A substrate is provided. An insulating film is formed on the substrate. In some embodiments, the insulating film includes a first portion and a second portion between the first portion and a circumference of the insulating film. The first portion of the insulating film includes a first thickness and the second portion of the insulating film includes a second thickness. In some embodiments, the second thickness is greater than the first thickness. In some embodiments, the second portion of the insulating film forms a topmost surface for the insulating film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A film forming apparatus comprising:
   a reaction chamber;
   a pedestal disposed inside the reaction chamber and configured to support a substrate; and
   a gas shower head over the pedestal, the gas shower head comprising a plurality of first holes and a plurality of second holes disposed between a circumference of the gas shower head and the first holes, wherein a diameter of an upper opening of the first holes is the same as a diameter of a lower opening of the first holes, wherein the first holes are arranged to form a first pattern and configured to form a first portion of a material film on the substrate, the second holes are arranged to form a second pattern and configured to form a second portion of the material film on the substrate, and a hole density of the second pattern is greater than a hole density of the first pattern.

2. The film formation apparatus of claim 1, wherein a thickness of the first portion is corresponding to the hole density of the first pattern, a thickness of the second portion is corresponding to the hole density of the second pattern, and the thickness of the second portion is greater than the thickness of the first portion.

3. The film formation apparatus of claim 1, wherein the first holes and the second holes are arranged in concentric circles from a center of the gas shower head to the circumference of the gas shower head.

4. The film formation apparatus of claim 1, wherein the hole density of the second pattern is at least about 2-4 times the hole density of the first pattern.

5. The film formation apparatus of claim 4, wherein the hole density of the second pattern are outwardly increased to the circumference of the gas shower head.

6. The film formation apparatus of claim 1, wherein the first holes and the second holes comprise a same shape and a same hole diameter.

7. The film formation apparatus of claim 1, wherein the first holes and the second holes are coupled to a gas supply system and operable to dispense a gas to the substrate inside the reaction chamber.

8. The film formation apparatus of claim 7, wherein the gas supply system is configured to provide a gas for chemical vapor deposition (CVD), plasma enhanced CVD (PECVD), or metal-organic CVD (MOCVD).

9. A film forming apparatus comprising:
a reaction chamber;
a pedestal disposed inside the reaction chamber and configured to support a substrate; and
a gas shower head over the pedestal, the gas shower head comprising:
   a plate;
   a plurality of central holes having a first hole density disposed in a central region of the plate and configured to form a first portion of a material film on the substrate, wherein a diameter of an upper opening of the central holes is the same as a diameter of a lower opening of the central holes; and
   a plurality of peripheral holes having a second hole density greater than the first hole density in a peripheral region and configured to form a second portion of the material film on the substrate,
wherein the first portion of the material film comprises a first thickness corresponding to the first hole density in the central region, the second portion of the material film comprises a second thickness corresponding to the second hole density in the peripheral region, and the second thickness is greater than the first thickness.

10. The film forming apparatus of claim 9, wherein the second hole density in the peripheral region is about 2-4 times the first hole density in the central region.

11. The film forming apparatus of claim 9, wherein the central holes and the peripheral holes are arranged in concentric circles.

12. The film forming apparatus of claim 9, wherein the central holes and the peripheral holes comprise a same shape and a same hole diameter.

13. The film forming apparatus of claim 9, wherein the gas shower head further comprises a plurality of middle holes having a third hole density disposed in a middle region between the peripheral region and the central region.

14. The film forming apparatus of claim 13, wherein the third hole density in the middle region is between the first hole density and the second hole density.

15. The film forming apparatus of claim 13, wherein the central holes, the middle holes and the peripheral holes are arranged in concentric circles.

16. The film forming apparatus of claim 13, wherein the central holes, the middle holes and the peripheral holes comprise a same shape and a same hole diameter.

17. The film forming apparatus of claim 13, wherein a width of the middle region is substantially equal to a width of the peripheral region.

18. A film forming apparatus comprising:
a reaction chamber;
a pedestal disposed inside the reaction chamber and configured to support a substrate; and
a gas shower head over the pedestal, the gas shower head comprising:
   a plate;
   a plurality of first holes having a first hole density, wherein a diameter of an upper opening of the first holes is the same as a diameter of a lower opening of the first holes;
   a plurality of second holes having a second hole density and disposed between the first holes and a circumference of the plate; and
   a plurality of third holes having a third hole density and disposed between the second holes and the circumference of the plate,
wherein the first holes are configured to form a first portion of a material film on the substrate, the second holes are configured to form a second portion of the material film on the substrate, the third holes are configured to form a third portion of the material film on the substrate, the third hole density of the third holes is greater than the second hole density of the second holes, and the second hole density of the second holes is greater than the first hole density of the first holes.

19. The film formation apparatus of claim 18, wherein a thickness of the first portion of the material film is corresponding to the first hole density of the first holes, a thickness of the second portion of the material film is corresponding to the second hole density of the second holes, and a thickness of the third portion of the material film is corresponding to the third hole density of the third holes.

20. The film formation apparatus of claim 19, wherein the thickness of the first portion of the material film is less than the thickness of the second portion of the material film, and the thickness of the second portion of the material film is less than the thickness of the third portion of the material film.

* * * * *